(12) United States Patent
Wang et al.

(10) Patent No.: US 6,355,568 B1
(45) Date of Patent: Mar. 12, 2002

(54) CLEANING METHOD FOR COPPER DUAL DAMASCENE PROCESS

(75) Inventors: Sung-Hsiung Wang, Kaohsiung Hsien; Chan-Lon Yang, Taipei, both of (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/580,041

(22) Filed: May 26, 2000

(51) Int. Cl.$^7$ .............................................. H01L 21/302
(52) U.S. Cl. ........................ 438/704; 438/745; 438/906; 134/26
(58) Field of Search .................. 438/704, 745, 438/754, 677, 906, 963; 134/26, 27, 28, 29

(56) References Cited

U.S. PATENT DOCUMENTS 6,066,028 A * 5/2000 Cheng et al.
6,127,282 A * 10/2000 Lopatin

FOREIGN PATENT DOCUMENTS

JP 10172942 * 6/1998

* cited by examiner

Primary Examiner—Caridad Everhart
(74) Attorney, Agent, or Firm—J. C. Patents

(57) ABSTRACT

A cleaning method for a copper dual damascene process, applicable for cleaning a structure having a dual damascene opening. The method begins with preparing a first chemical solution and a second chemical solution. The first chemical solution includes a deionized water, a hydrogen peroxide, and a surfactant, whereas the second chemical solution includes a deionized water, a hydrogen fluoride, and a hydrogen chloride. A first cleaning step is performed using the first chemical solution to remove particles and polymers that remain on a surface of a copper layer and the dual damascene opening. This is followed by performing a second cleaning step using the second chemical solution to remove a copper oxide layer on the copper layer.

22 Claims, 2 Drawing Sheets

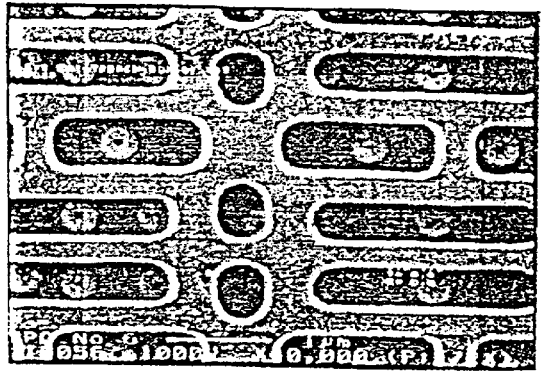
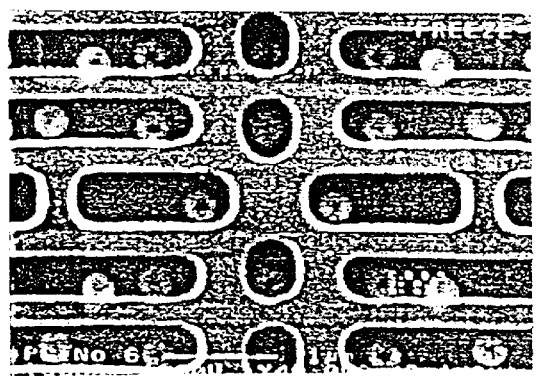
FIG. 2A
FIG. 2B
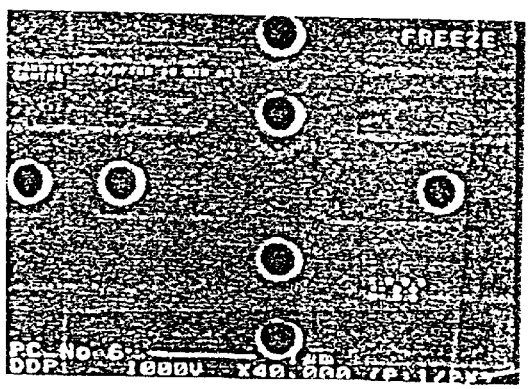
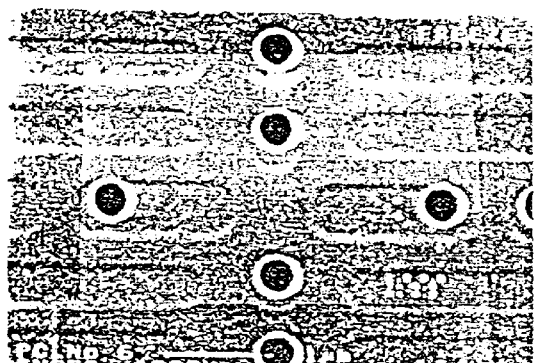
FIG. 2C
FIG. 2D

CLEANING METHOD FOR COPPER DUAL DAMASCENE PROCESS

BACKGROUND OF THE INVENTION

1. Field of Invention

The present invention relates to an integrated circuit (IC) fabrication method. More particularly, the invention relates to a cleaning method for a copper dual damascene process.

2. Description of Related Art

In an ultra large-scale integration (ULSI) circuit, a multilevel interconnects design is usually adopted to prevent an increased density of the interconnects in a highly integrated circuit. Typically, a copper (Cu) dual damascene process is widely practiced in most semiconductor industry, since Cu is excellent in mitigating problems such as electromigration in certain metal layers, and a RC time delay in transmitting an electrical signal between the metal interconnects.

In a backend process of the dual damascene process, it is essential to remove process contaminants, such as copper oxide ($CuO_x$), particles, and polymers that remain after the etching step is performed to form an opening. The process contaminants are removed using a solvent in a conventional cleaning step. However, without a thorough clean, remnants from the cleaning step appear in the opening. As the integration of the IC increases, its process window decreases, while the remnants in the opening have a larger impact for the subsequent process. For instance, this leads to a higher via resistance for a product device.

SUMMARY OF THE INVENTION

The invention provides a cleaning method for a copper dual damascene process, which method effectively removes the remnants on the copper layer to obtain a wider process window, as well as a lower via resistance.

As embodied and broadly described herein, the invention provides a cleaning method for a copper dual damascene process, applicable for cleaning a structure having a dual damascene opening. The method begins with preparing a first chemical solution and a second chemical solution. The first chemical solution includes deionized water, hydrogen peroxide, and surfactant, whereas the second chemical solution includes deionized water, hydrogen fluoride, and hydrogen chloride. A first cleaning step is performed using the first chemical solution to remove particles and polymers that remain on a surface of a copper layer and the dual damascene opening.

A second cleaning step is then performed using the second chemical solution to remove a copper oxide layer on the copper layer. The dual damascene opening is filled with another copper layer to complete the dual damascene fabrication process.

Since the dual damascene structure is cleaned using two different chemical solutions, instead of using a conventional cleaning solvent, particles, polymers, and copper oxide layer are completely removed from the surface of the copper layer. As a result, a wider process window is obtained, together with a lower via resistance.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

FIG. 2A illustrates an image of a trench opening without being cleaned in any cleaning step;

FIG. 2B illustrates an image of a trench opening after being cleaned in the first and second cleaning steps;

FIG. 2C illustrates an image of a via opening without being cleaned in any cleaning step; and FIG. 2D illustrates an image of a via opening after being cleaned in the first and second cleaning steps.

DESCRIPTION OF THE PREFERRED EMBODIMENTS

Figure 1:
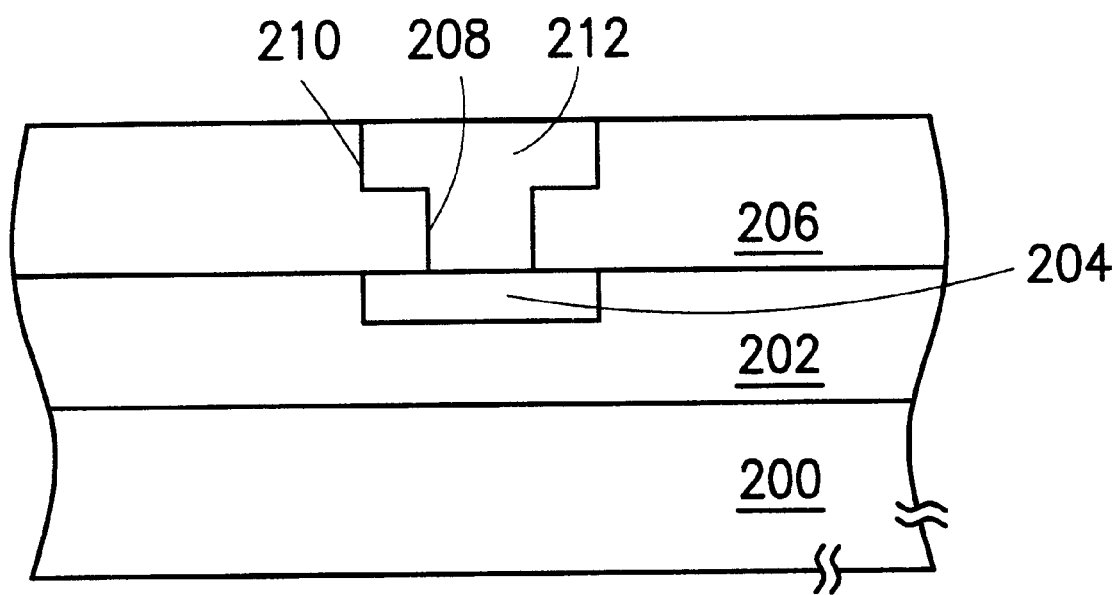
FIG. 1 is a schematic, cross-sectional diagram illustrating a dual damascene structure.

Referring to FIG. 1, a substrate 200 is provided with a dielectric layer 202 formed thereon, while the dielectric layer 202 has a copper layer 204 formed therein. Another dielectric layer 206 is formed on the dielectric layer 202, while a part of the dielectric layer 206 is removed by etching to form a via opening 208 and a trench opening 210 in the dielectric layer 206. The via opening 208 and the trench opening 210 together form a dual damascene opening for exposing a part of the copper layer 204. During the step of etching the dielectric layer 206, an etching solution involved may react with residues that remain on a surface of the via opening 208 and the trench opening 210 to form polymers and particles. Further, when the etching is performed until the copper layer 204 is exposed, a top portion of the copper layer is readily oxidized to form a copper oxide layer in a thermal environment. As the copper oxide layer has a poor conductivity, it results a high resistance in the subsequent process. As a means to remove the particles and polymers on the surface of the via opening 208 and the trench opening 210, as well as to remove the copper oxide layer on the copper layer 204, the following cleaning steps are performed.

A first chemical solution and a second chemical solution are prepared, wherein the first chemical solution includes deionized water, hydrogen peroxide, and surfactant, and the second chemical solution includes deionized water, hydrogen fluoride, and hydrogen chloride. The first chemical solution is made by mixing deionized water, hydrogen peroxide, and surfactant in a preferred ratio of about 80:2.2:1.4, while the second chemical solution is made by mixing deionized water, hydrogen fluoride, and hydrogen chloride in a preferred ratio of about 600:1:8.5.

A first cleaning step is performed using the first chemical solution for about 8 to 12 minutes on a surface of the copper layer 204, the via opening 208, and the trench opening 210. The first copper layer 204, the via opening 208, and the trench opening 210 are dipped in the first chemical solution, so that the particles and polymers are removed therefrom through an oxidative power of hydrogen peroxide and a degreasing power of surfactant. A second cleaning step is then performed using the second chemical solution for about 2 to 5 minutes. The first copper layer 204, the via opening 208, and the trench opening 210 are dipped in the second chemical solution, so that the copper oxide layer that forms on the copper layer 204 is removed. This is achieved through hydrolyzing the copper oxide ($CuO_x$) using acidic hydrogen fluoride and hydrogen chloride into soluble copper fluoride ($CuF_{2x}$) and copper chloride ($CuCl_2$) in order to clean the surface of the copper layer 204 by removing the copper oxide layer.

Alternatively, the second cleaning step is performed prior to the first cleaning step to get the same result as described in the above embodiment. Therefore, regardless of the sequence of the cleaning steps, the same cleaning result can be obtained as long as both the first cleaning step and the second cleaning step are performed.

Referring both to FIGS. 2A and 2B, wherein FIG. 2A illustrates an image of the trench opening not being cleaned in any cleaning step, FIG. 2B illustrates an image of the trench opening after being cleaned in the first and second cleaning steps. By comparison, the image of the trench opening in FIG. 2B has a better contrast than that in FIG. 2A. This implies a better cleaning effect can be obtained through performing the first cleaning step and the second cleaning step according to the above embodiment.

Also, referring to FIGS. 2C and 2D, wherein FIG. 2C illustrates an image of the via opening not being cleaned in any cleaning step, FIG. 2B illustrates an image of the via opening after being cleaned in the first and second cleaning steps. By comparison, the image of the trench opening in FIG. 2D has a better contrast than that in FIG. 2C. This implies a better cleaning effect can be obtained through performing the first cleaning step and the second cleaning step according to the above embodiment.

Referring back to FIG. 1 again, the via opening 208 and the trench opening 210 are filled with a copper layer 212 so as to form a dual damascene structure.

Summarizing the above, the present invention provides a cleaning method for copper dual damascene process, which method performs the first cleaning step using the first chemical solution to remove particles and polymers that remain on a surface of the copper layer and the dual damascene opening. Next, the second cleaning step is performed using the second chemical solution to remove the copper oxide layer on the copper layer. As a result, a wider process window is obtained, together with a lower via resistance.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A cleaning method for copper (Cu) dual damascene process, applicable for cleaning a structure having a dual damascene opening, the method comprising:

preparing a first chemical solution;

preparing a second chemical solution;

cleaning the structure having a dual damascene opening using the first chemical solution, so that particles and polymers in the dual damascene opening are removed; and cleaning the structure having a dual damascene opening using the second chemical solution, so that oxides in the dual damascene opening are removed.

2. The method of claim 1, wherein the step of preparing the first chemical solution includes mixing a deionized water, a hydrogen peroxide, and a surfactant.

3. The method of claim 2, wherein the deionized water, the hydrogen peroxide, and the surfactant are mixed in a ratio of about 80 to 2.2 to 1.4.

4. The method of claim 2, wherein the first chemical solution is used for about 8 to 12 minutes in the step of cleaning the structure having a dual damascene opening.

5. The method of claim 1, wherein the step of preparing the second chemical solution includes mixing a deionized water, a hydrogen fluoride, and a hydrogen chloride.

6. The method of claim 5, wherein the deionized water, the hydrogen fluoride, and the hydrogen chloride are mixed in a ratio of about 600 to 1 to 8.5.

7. The method of claim 6, wherein the second chemical solution is used for about 2 to 5 minutes in the step of cleaning the structure having a dual damascene opening.

8. The method of claim 1, wherein the step of preparing the first chemical solution includes mixing a deionized water, a hydrogen fluoride, and a hydrogen chloride.

9. The method of claim 8, wherein the deionized water, the hydrogen fluoride, and the hydrogen chloride are mixed in a ratio of about 600 to 1 to 8.5.

10. The method of claim 8, wherein the first chemical solution is used for about 2 to 5 minutes in the step of cleaning the structure having a dual damascene opening.

11. The method of claim 8, wherein the step of preparing the second chemical solution includes mixing a deionized water, a hydrogen peroxide, and a surfactant.

12. The method of claim 11, wherein the deionized water, the hydrogen peroxide, and the surfactant are mixed in a ratio of about 80 to 2.2 to 1.4.

13. The method of claim 11, wherein the second chemical solution is used for about 8 to 12 minutes in the step of cleaning the structure having a dual damascene opening.

14. A cleaning method applicable to a copper (Cu) dual damascene process comprising:

providing a substrate having a dielectric layer with a via opening and a trench thereon, wherein the via opening and the trench exposes a conductive layer, and a plurality of polymer impurities formed in the via opening and the trench during the via opening and the trench are formed;

cleaning the via opening and the trench using a first chemical solution and a second chemical solution in sequence so that the polymer impurities in the via opening and the trench and the metal oxide on the exposed conductive layer are removed; and forming a copper layer for filling the via opening and the trench, so as to complete the Cu dual damascene process.

15. The method of claim 14, wherein the step of cleaning the via opening and the trench using the first chemical solution further comprising:

mixing a deionized water, a hydrogen peroxide, and a surfactant for preparing the first chemical solution; and dipping the via opening and the trench in the first chemical solution for about 8 to 12 minutes for removing particles and polymers therefrom.

16. The method of claim 15, wherein the deionized water, the hydrogen peroxide, and the surfactant are mixed in a ratio of about 80 to 2.2 to 1.4.

17. The method of claim 14, wherein the step of cleaning the via opening and the trench using the second chemical solution further comprising:

mixing a deionized water, a hydrogen fluoride, and a hydrogen chloride for preparing the second chemical solution; and dipping the via opening and the trench in the second chemical solution for about 2 to 5 minutes for removing oxides that are formed therefrom.

18. The method of claim 17, wherein the deionized water, the hydrogen fluoride, and the hydrogen chloride are mixed in a ratio of about 600 to 1 to 8.5.

19. The method of claim 14, wherein the step of cleaning the via opening and the trench using the first chemical solution further comprising:

mixing a deionized water, a hydrogen fluoride, and a hydrogen chloride for preparing the first chemical solution; and dipping the via opening and the trench in the first chemical solution for about 2 to 5 minutes for removing oxides that are formed therefrom.

20. The method of claim 19, wherein the deionized water, the hydrogen fluoride, and the hydrogen chloride are mixed in a ratio of about 600 to 1 to 8.5.

21. The method of claim 14, wherein the step of cleaning the via opening and the trench using the second chemical solution further comprising:

mixing a deionized water, a hydrogen peroxide, and a surfactant for preparing the second chemical solution; and dipping the via opening and the trench in the first chemical solution for about 8 to 12 minutes for removing particles and polymers therefrom.

22. The method of claim 21, wherein the deionized water, the hydrogen peroxide, and the surfactant are mixed in a ratio of about 80 to 2.2 to 1.4.

* * * * *